US006377128B1

(12) United States Patent
Moyal et al.

(10) Patent No.: US 6,377,128 B1
(45) Date of Patent: Apr. 23, 2002

(54) CIRCUITRY, ARCHITECTURE AND METHOD (S) FOR PHASE MATCHING AND/ OR REDUCING LOAD CAPACITANCE, CURRENT AND/OR POWER CONSUMPTION IN AN OSCILLATOR

(75) Inventors: Nathan Y. Moyal, Austin; Mark Marlett, Georgetown, both of TX (US)

(73) Assignee: Cypress Semiconductor Corp., San Jose, CA (US)

(*) Notice: Subject to any disclaimer, the term of this patent is extended or adjusted under 35 U.S.C. 154(b) by 0 days.

(21) Appl. No.: 09/966,603

(22) Filed: Sep. 28, 2001

Related U.S. Application Data

(63) Continuation of application No. 09/383,328, filed on Aug. 26, 1999.

(51) Int. Cl.[7] .............................. H03B 5/24; H03B 5/20
(52) U.S. Cl. ..................... 331/57; 331/177 R; 331/34
(58) Field of Search ........................... 331/1 A, 17, 23, 331/34, 36 C, 57, 177 R, 179

(56) References Cited

U.S. PATENT DOCUMENTS 3,424,870 A * 1/1969 Breeden et al. ............... 179/84
3,699,477 A * 10/1972 McKell ....................... 331/142
4,397,211 A 8/1983 Ferdinand ................... 84/1.26
5,302,920 A 4/1994 Bitting ......................... 331/45
5,790,479 A * 8/1998 Conn .......................... 368/118

OTHER PUBLICATIONS

FP 15.1: A 1.0625Gbps Transceiver with 2x–Oversampling and Transmit Signal Pre–Emphasis, By Alan Fiedler et al., ISSCC97/Session 15/Serial Data Communications/Paper FP 15.3, pp. 186–187.

FP 15.3: A 1.25 Gb/s, 460 mW CMOS Transceiver for Serial Data Communication, By Dao–long Chen et al., ISSCC97/ Session 15/Serial Data Communications/Paper FP15.3, pp. 190–191.

* cited by examiner

Primary Examiner—David Mis
(74) Attorney, Agent, or Firm—Christopher P. Maiorana, P.C.

(57) ABSTRACT

An apparatus comprising a first circuit and a second circuit. The first circuit may be configured to generate a plurality of clock signals each in response to (i) one or more control inputs and (ii) one or more of a plurality of phase timing elements. The second circuit may be configured to generate the plurality of phase timing elements.

20 Claims, 10 Drawing Sheets

MULTI-PHASE ARE USED TO RUN THE PHASE DETECTOR AT HIGHER FREQUENCY. THIS ALLOWS HIGHER DATA FREQUENCY TO BE PROCESSED.

EACH R IS MADE OF PARALLEL R's

CIRCUITRY, ARCHITECTURE AND METHOD (S) FOR PHASE MATCHING AND/OR REDUCING LOAD CAPACITANCE, CURRENT AND/OR POWER CONSUMPTION IN AN OSCILLATOR

This is a continuation of U.S. Ser. No. 09/383,328 filed Aug. 26, 1999.

FIELD OF THE INVENTION

The present invention relates to voltage controlled oscillators (VCOs) generally and, more particularly, to circuitry, architecture and method(s) for phase matching and/or reducing load capacitance, current and/or power consumption in an oscillator.

BACKGROUND OF THE INVENTION

Voltage controlled oscillators (VCOs) are used in phase lock loops (PLLs) to generate clocks having particular frequencies. PLLs are generally considered clock multipliers. For example, an input reference clock having a frequency of 10 Mhz can be multiplied by the PLL to yield an output clock signal having a frequency of 200 Mhz. Ideally, this clock multiplication would result in an output clock that is in perfect phase/frequency with the reference clock. In clock recovery systems, the PLL is used to align a particular data pattern with the output clock. In these applications, a phase frequency detector (PFD) is used to generate the proper frequency, while a phase detector (PD) is used to align the data pattern to the output clock.

FIG. 1 illustrates a conventional phase lock loop circuit 10. The circuit 10 has a phase detector (PD) 12, a phase frequency detector (PFD) 14, a loop filter 16, a voltage control filter 18, a voltage controlled oscillator 20 and a divider 22. The VCO 20 presents a signal to the divider 22. The divider 22 presents a feedback signal to the PFD 14 and the PD 12. The PFD 14 also receives a reference clock signal. The PD 12 also receives a data signal. The difference in frequency between the reference clock and the feedback signal is used to generate two control signals that are presented to the loop filter 16. The loop filter 16 presents a signal to the voltage controlled oscillator 20 in response to the control signals. During normal operating conditions, the reference clock is generally synchronized with the feedback signal. Such a synchronization is shown by the block 24.

A common type of VCO that may be used in a PLL is a ring VCO. FIG. 2 illustrates the construction of a ring VCO 30. The ring VCO 30 comprises several inverting stages 32a–32n. The inverting stages 32a–32n are connected in series. An output 34 of the last stage 32n is looped back to an input 36 of the first stage 32a with enough propagation delay to allow sufficient phase margin for an inversion. The output of each stage is shifted in phase from the previous stage. The magnitude of the shift is determined by the stage delay.

A ring VCO having outputs of individual stages accessible is generally considered a multi-phase VCO. The multi-phase VCO is attractive because it allows the use of "slower" parallel architecture. A serial high speed architecture is less desirable due to the high current and timing limitations that are required. Applications of multi-phase VCOs are illustrated in FIGS. 3A–C.

The matching of the phase shifts of each stage is critical for many phase sensitive applications. In an application is where an XOR gate is used to multiply a clock frequency (e.g., FIG. 3B), if the phases are not matched well, a 50% duty cycle output may not be possible. In a phase detector (PD) application (e.g., FIGS. 3A and 3C), a phase mismatch will result in static phase error, and/or jitter.

In order to reduce phase mismatch, the conventional approaches compensate for differences in stage delay. The compensation has included additional components or variation in the placement of the stages. FIG. 4 is a diagram illustrating a conventional method where compensation for phase mismatch is accomplished by matched resistors and matched capacitive loading by the addition of line capacitance to compensate for load mismatch. This method only compensates for a linear silicon gradient. Interconnect lines are not matched and critical matching elements are not localized.

FIG. 5 is a diagram illustrating placement of stages to equalize interconnect line capacitance. This method matches the interconnect lines. No compensation for silicon gradient is provided. Additionally, critical matching components are not localized.

FIG. 6 is a diagram illustrating variation in the placement of the stages to compensate for the layout gradient. Variation in stage placement only compensates for a linear silicon gradient. The interconnect lines are not matched. The critical matching elements are not localized.

FIG. 7 is a diagram illustrating centroiding the stages to reduce phase mismatch. This method requires separate power buses and power supply voltage drop matching across rows. The critical nodes (control nodes) are spread across switching nodes. The critical matching elements are not localized.

FIG. 8 is a diagram illustrating the use of a 2× VCO and a divider to get a 50% duty cycle clock signal without correcting for phase mismatch. A VCO running at 2× requires high power.

The conventional methods compensate only for a linear silicon gradient or match interconnect lines. The critical matching elements remain distributed among the stages. The distributed loads must be larger to phase match the stages.

SUMMARY OF THE INVENTION

The present invention concerns an apparatus comprising a first circuit and a second circuit. The first circuit may be configured to generate a plurality of clock signals each in response to (i) one or more control inputs and (ii) one or more of a plurality of phase timing elements. The second circuit may be configured to generate the plurality of phase timing elements.

The objects, features and advantages of the present invention include providing an apparatus that may: (i) improve the process gradient and the effect of temperature variation across a chip; (ii) provide good stage-to-stage gradient cancellation; (iii) improve resistor gradient cancellation by localizing the resistor gradient cancellation; (iv) improve resistor matching due to non-linear factors (e.g., non-linear gradient variables) while reducing load size by localizing the resistors; (v) facilitate randomizing the resistors while maintaining identical resistor gradient cancellation; (vi) reduce the layout size of the inverter stages; (vii) provide tighter layout and better matching by using space that would otherwise be wasted; and/or (viii) reduce load capacitance in each VCO stage.

BRIEF DESCRIPTION OF THE DRAWINGS

These and other objects, features and advantages of the present invention will be apparent from the following detailed description and the appended claims and drawings in that:

DETAILED DESCRIPTION OF THE PREFERRED EMBODIMENTS

Figure 9:
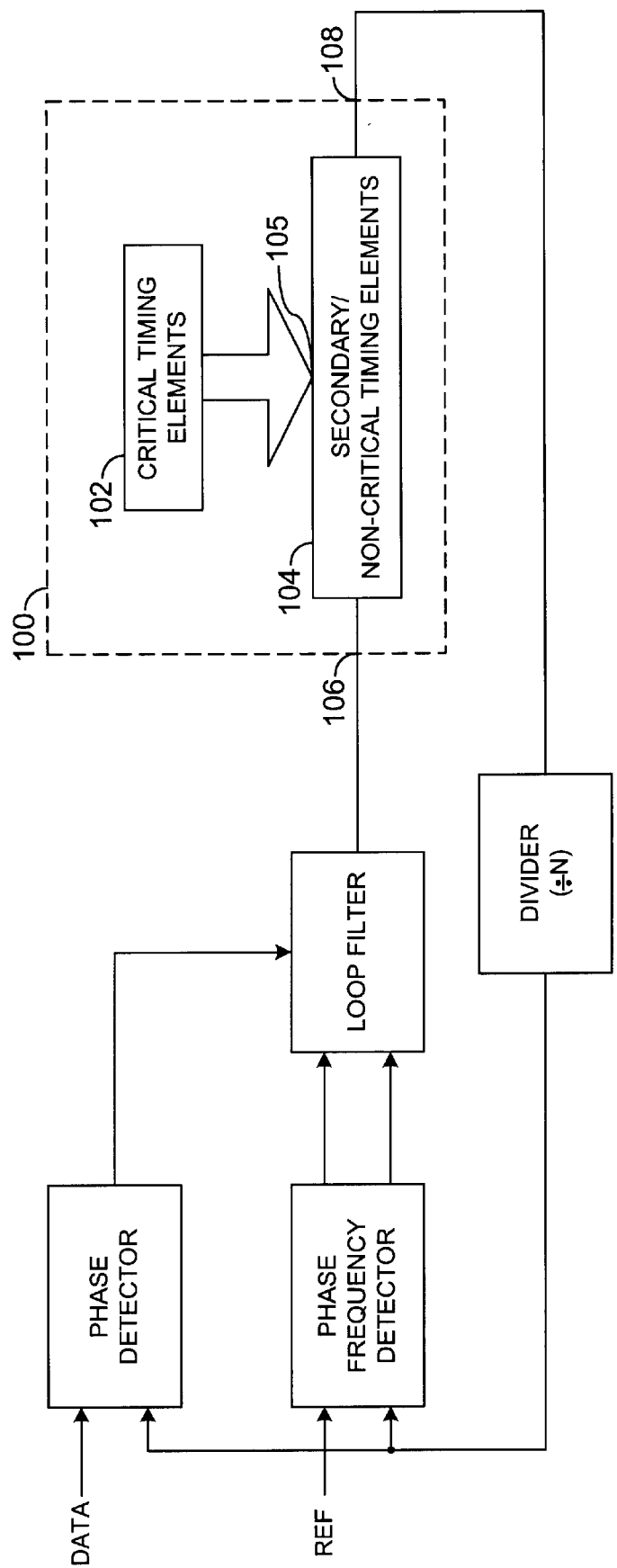
FIG. 9 is a block diagram of a preferred embodiment of the present invention.

Referring to FIG. 9, a block diagram of a circuit 100 is shown in accordance with a preferred embodiment of the present invention. In one example, the circuit 100 may be a multi-stage VCO circuit. The circuit 100 is shown implemented in the context of a PLL circuit 80. The circuit 100 generally comprises a circuit 102 and a circuit 104. The circuit 102 may comprise the critical phase timing elements of the circuit 100. In one example, the critical phase timing elements may be one or more loads presented to the circuit 104. The circuit 104 may comprise the non-critical phase timing elements of the circuit 100. The circuit 104 may be implemented as a multi-stage clock circuit. The circuit 100 generally comprises an input 106 and an output 108. The input 106 may be one or more bits wide. The output 108 may be one or more bits wide.

The circuit 102 may be configured to generate a plurality of loads. The plurality of phase timing elements may be (i) localized, (ii) gradient compensated, and/or (iii) randomized. The circuit 104 may be configured to receive the plurality of phase timing elements at an input 105. The circuit 104 may also be configured to receive one or more control signals from the input 106. The circuit 104 may be configured to generate a plurality of clock signals at the output 108, each in response to (i) one or more of the control signals, and (ii) one or more of the plurality of phase timing elements.

Figure 1:
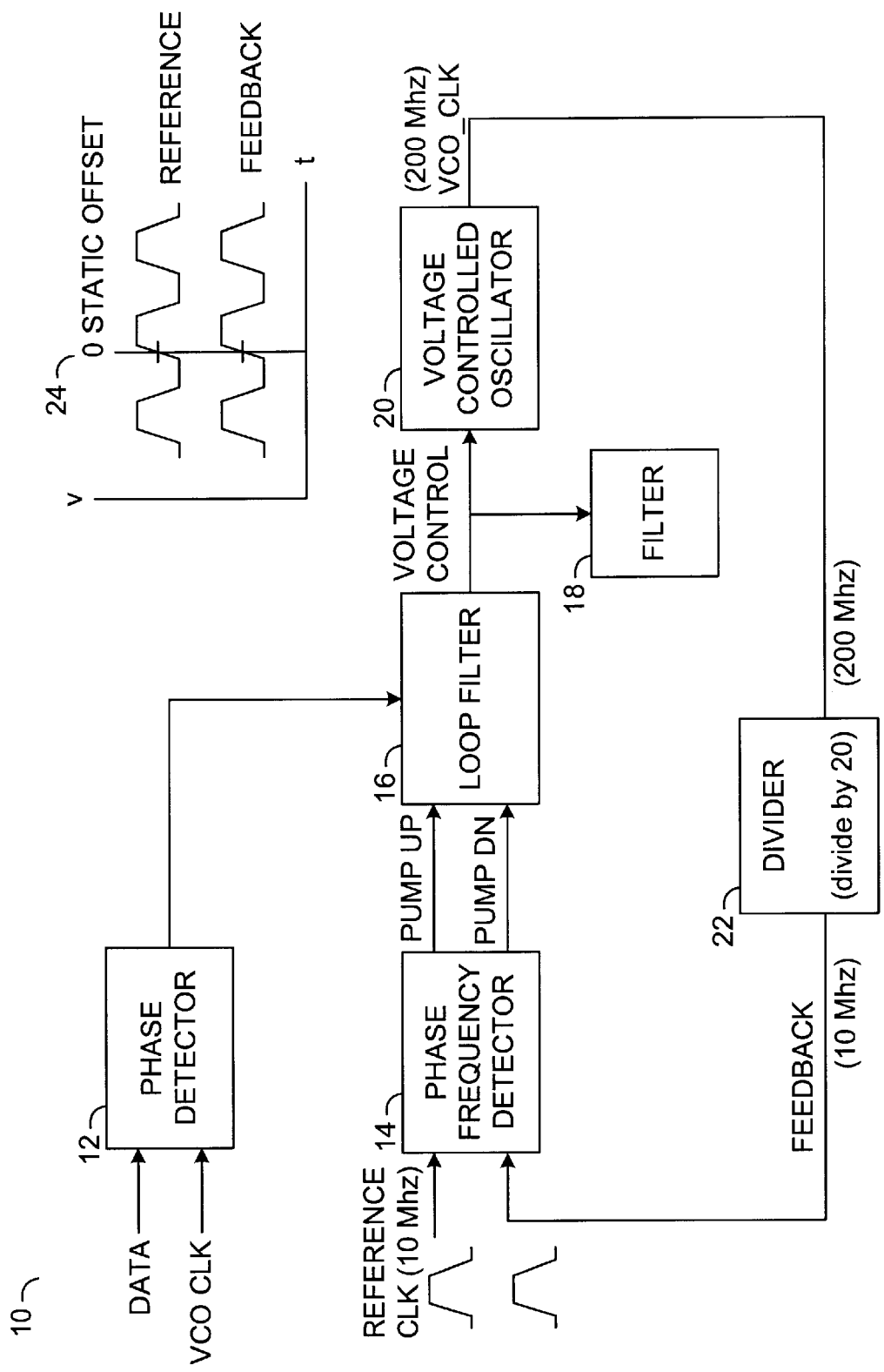
FIG. 1 is a diagram illustrating a conventional PLL.
Figure 2:
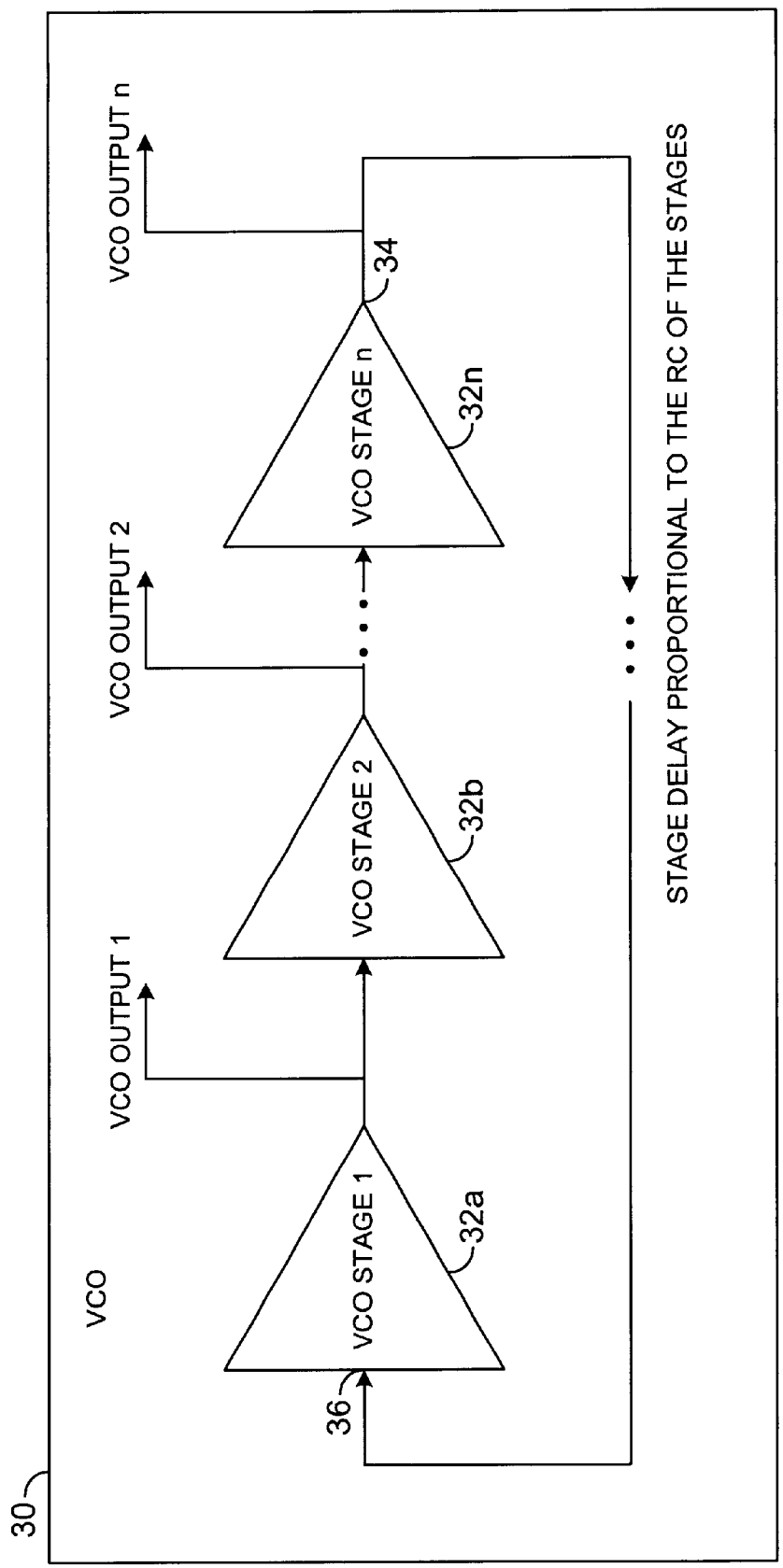
FIG. 2 is a diagram illustrating a conventional ring VCO.
Figure 3A:
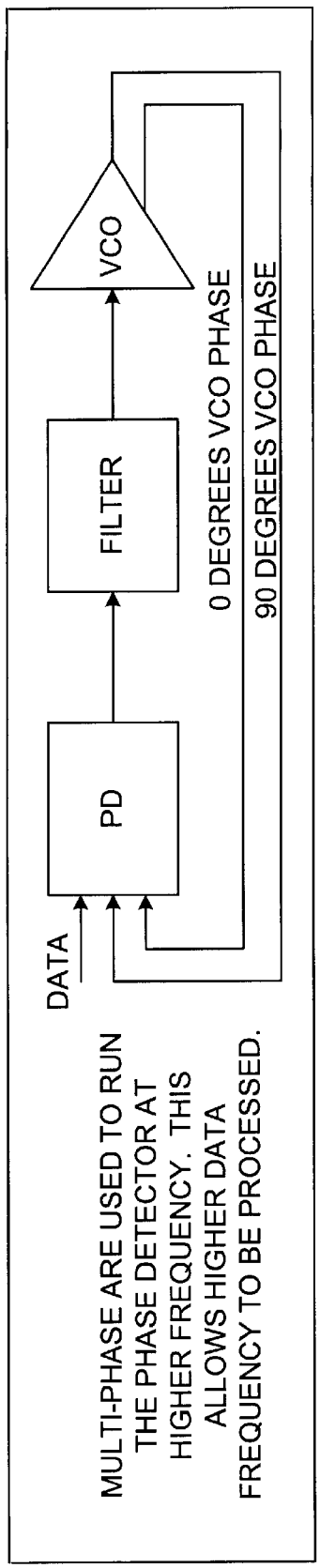
FIGS. 3A–C are diagrams illustrating multi-phase VCO applications.
Figure 3B:
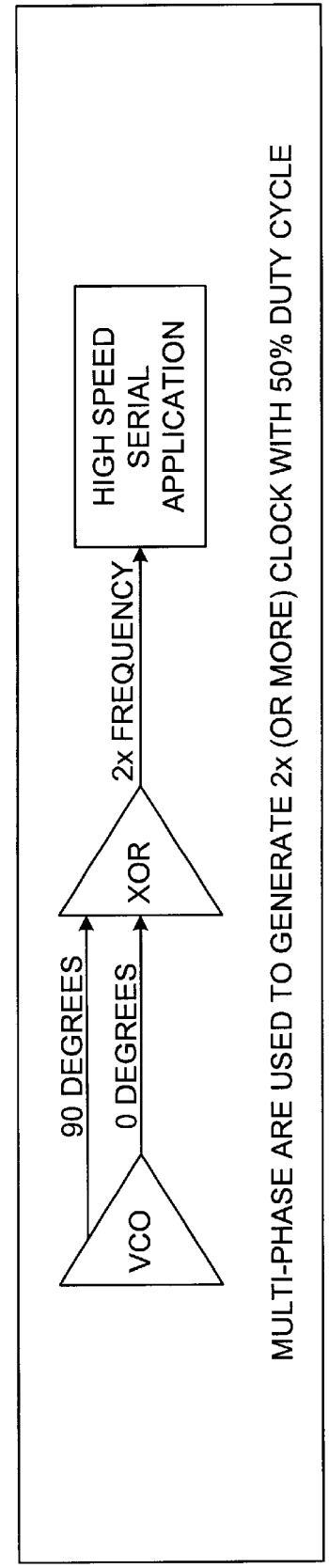
Figure 3C:
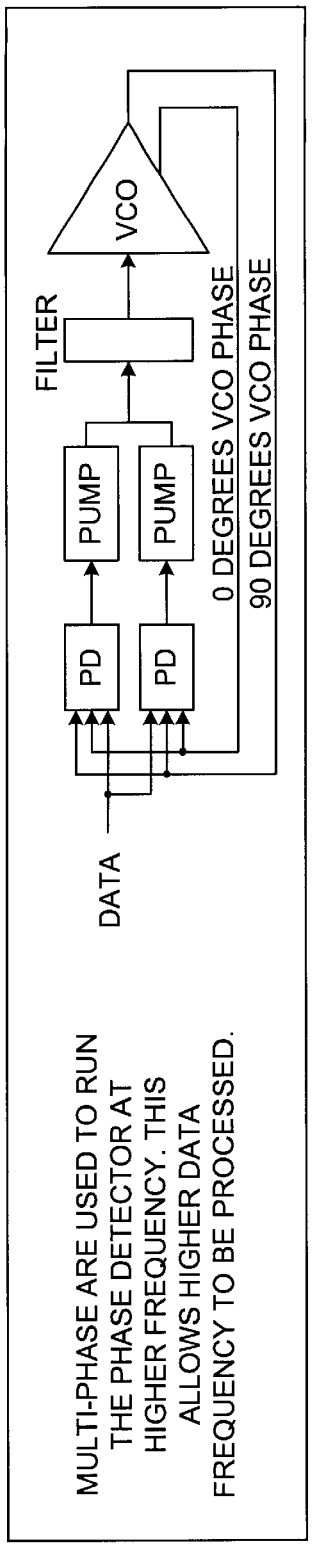
Figure 4:
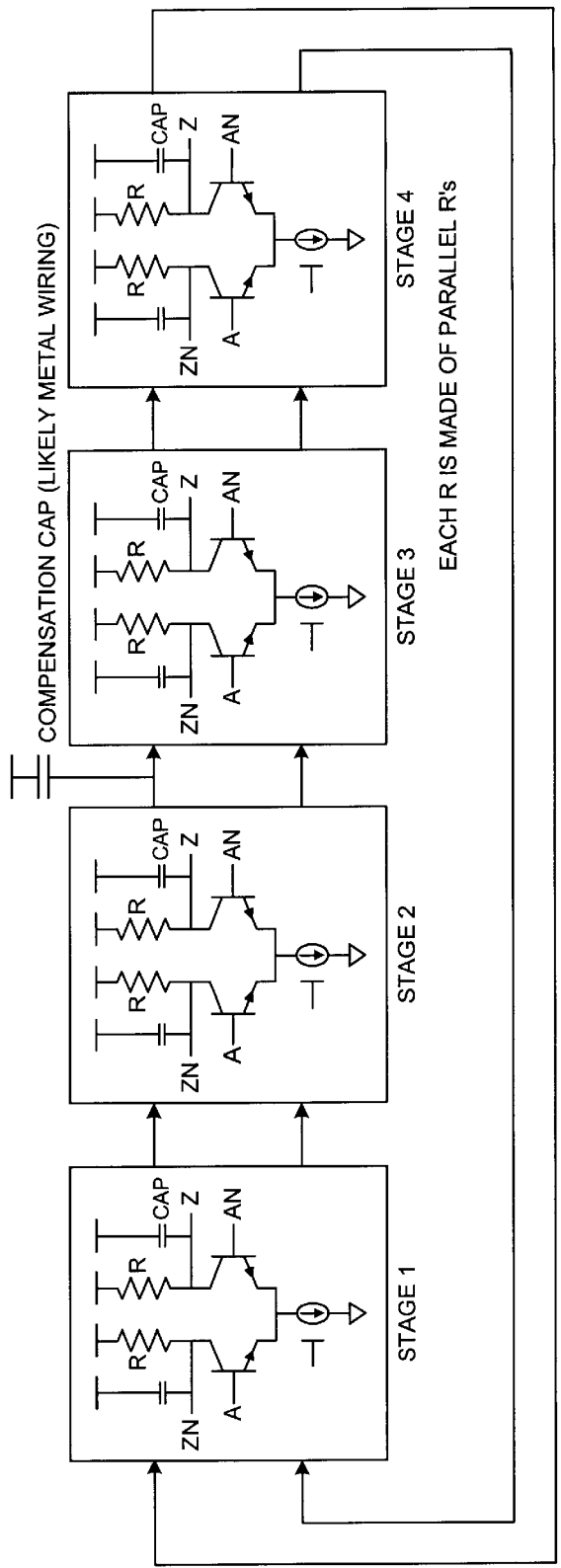
FIGS. 4–8 are diagrams illustrating conventional approaches to phase matching of VCO stages.
Figure 5:
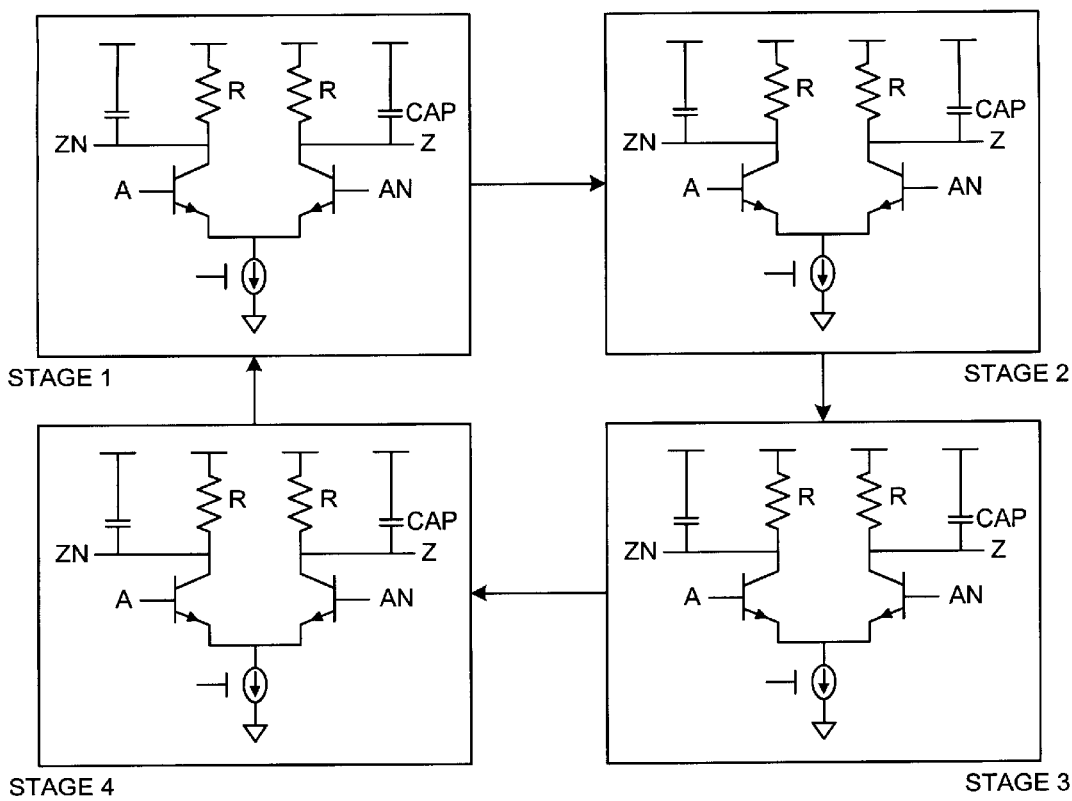
Figure 10:
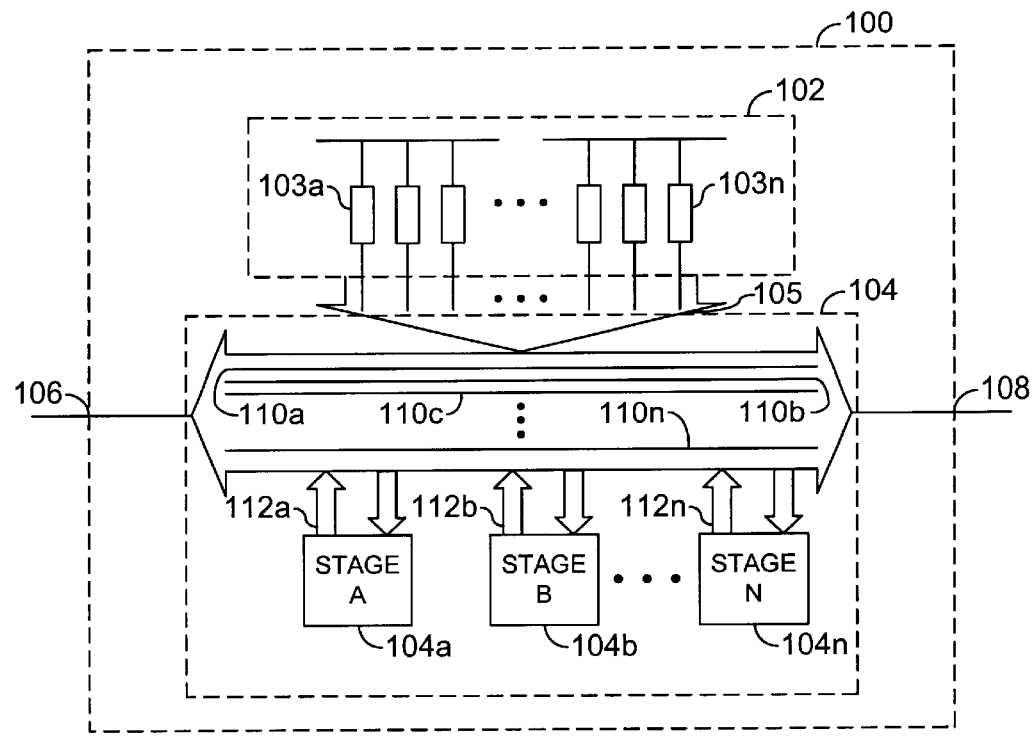
FIG. 10 is a more detailed block diagram of a preferred embodiment of the present invention.
Figure 6:
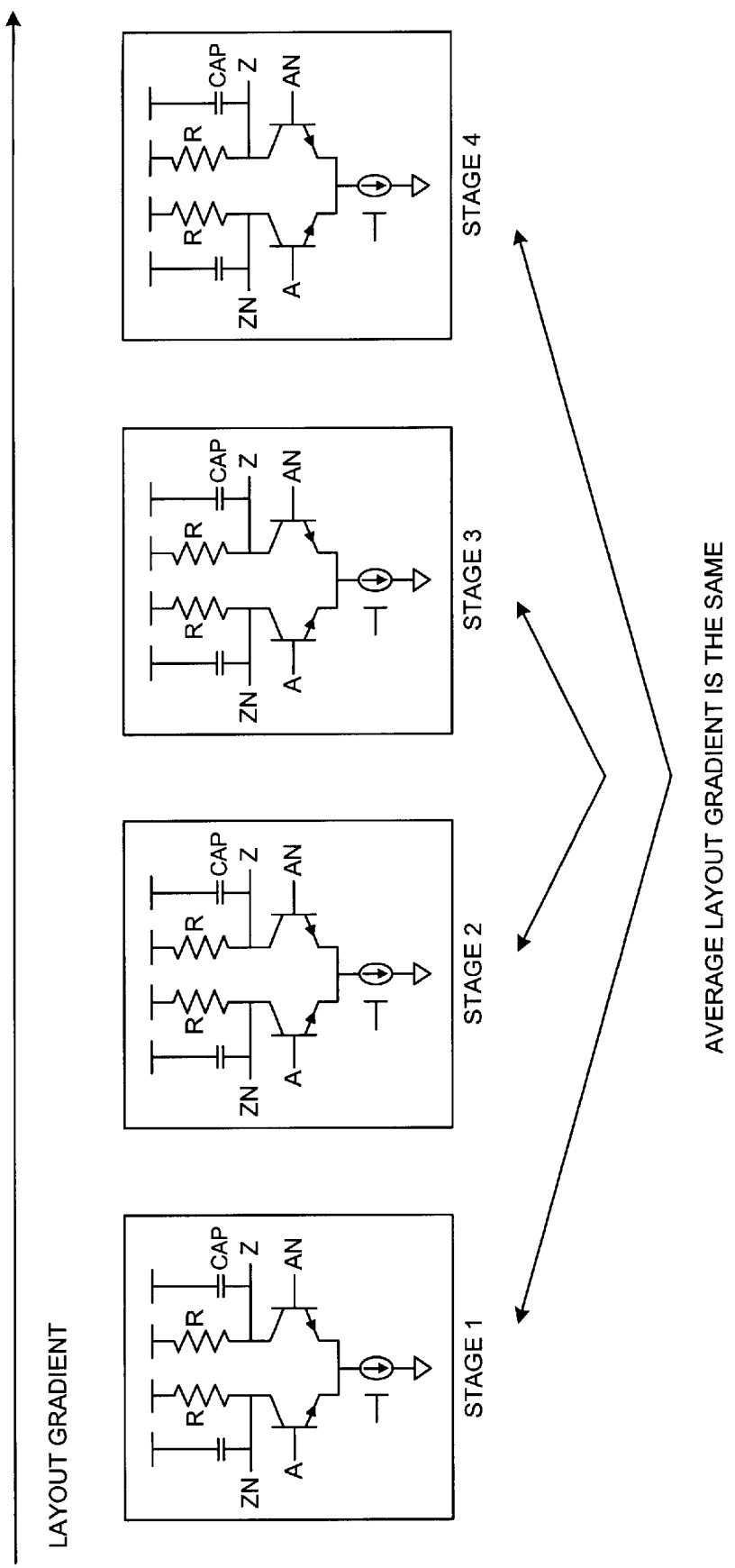
Figure 7:
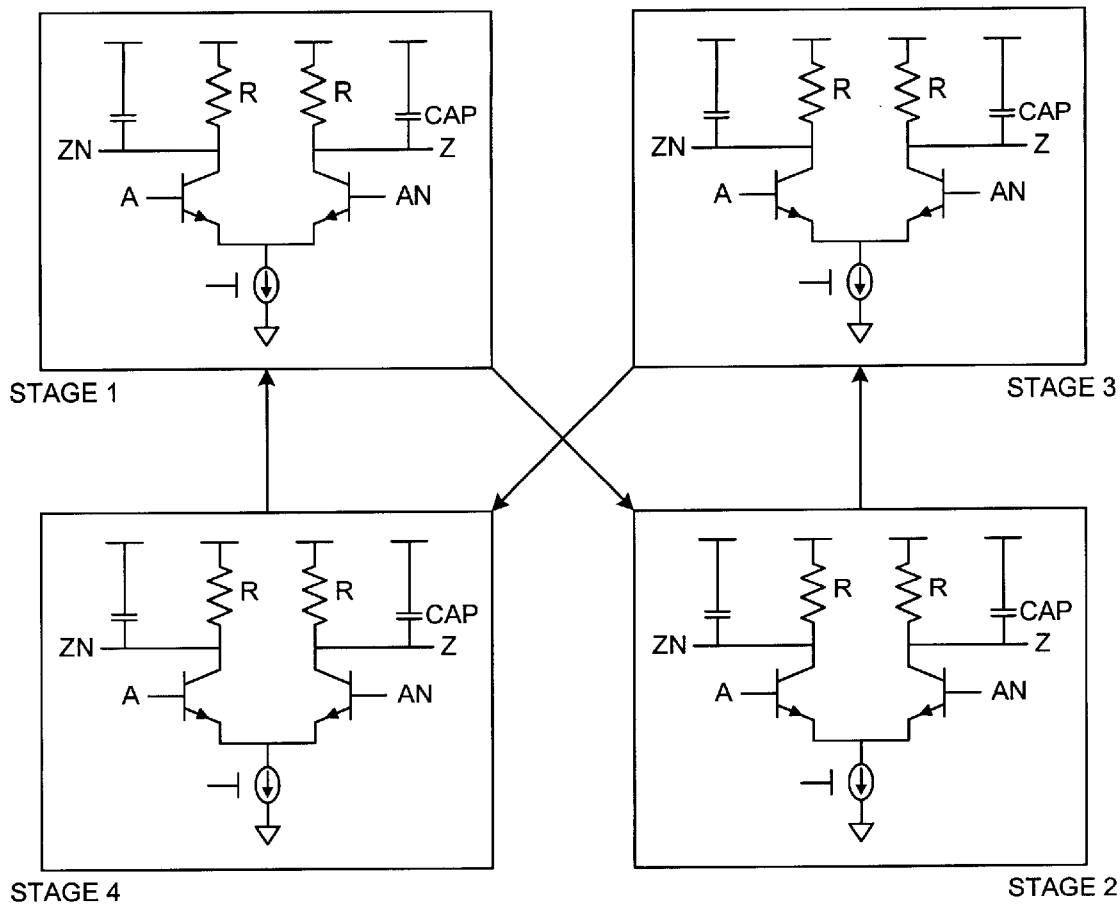
Figure 8:
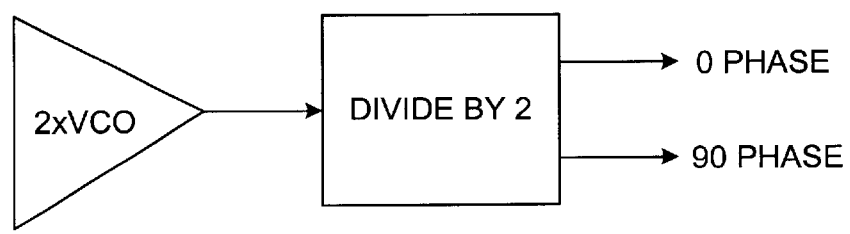

Referring to FIG. 10, a more detailed block diagram of the circuit 100 is shown. The phase timing circuit 102 generally comprises a plurality of phase timing elements 103a–103n. The circuit 104 generally comprises (i) a plurality of stages 104a–104n and (ii) a plurality of interconnect lines 110a–110n. The plurality of interconnect lines 110a–110n may be stretched, in one example, across all the stages 104a–104n to provide generally identical capacitance matching and equal gradient. However, non-equal interconnect lines 110a–110n may be implemented accordingly to meet the design criteria of a particular implementation. The plurality of interconnect lines 110a–110n may be placed such that the average layout gradients are equalized.

The plurality of stages 104a–104n may be implemented, in one example, as differential input inverters comprising a differential pair connected to a constant current source. However, single-ended inputs may be implemented accordingly to meet the design criteria of a particular implementation. The plurality of stages 104a–104n may be connected to one another by the interconnect lines 110a–110n. The plurality of stages 104a–104n may be, in one example, serially connected (i.e., 104a to 104b . . . to 104n) with the last stage 104n connected to the first stage 104a. The plurality of stages 104a–104n may be connected such that the average layout gradients are equalized. The plurality of phase timing elements 103a–103n may be connected to the plurality of stages 104a–104n by the plurality of interconnect lines 110a–110n. The plurality of phase timing elements 103a–103n may be placed atop the interconnect lines 110a–110n to conserve space.

Each stage of the plurality of stages 104a–104n may be configured to receive one or more different load combinations from the plurality of phase timing elements 103a–103n. Each of the plurality of stages 104a–104n may be configured to generate one or more of the plurality of clock signals 112a–112n in response to (i) one or more control inputs and (ii) one or more different load combinations of the plurality of phase timing elements 103a–103n. The clock signals 112a–112n may be used as control signals. The clock signals 112a–112n may be used as a multi-phase clock. The clock signals 112a–112n may be connected to the interconnect lines 110a–110n.

Figure 11:
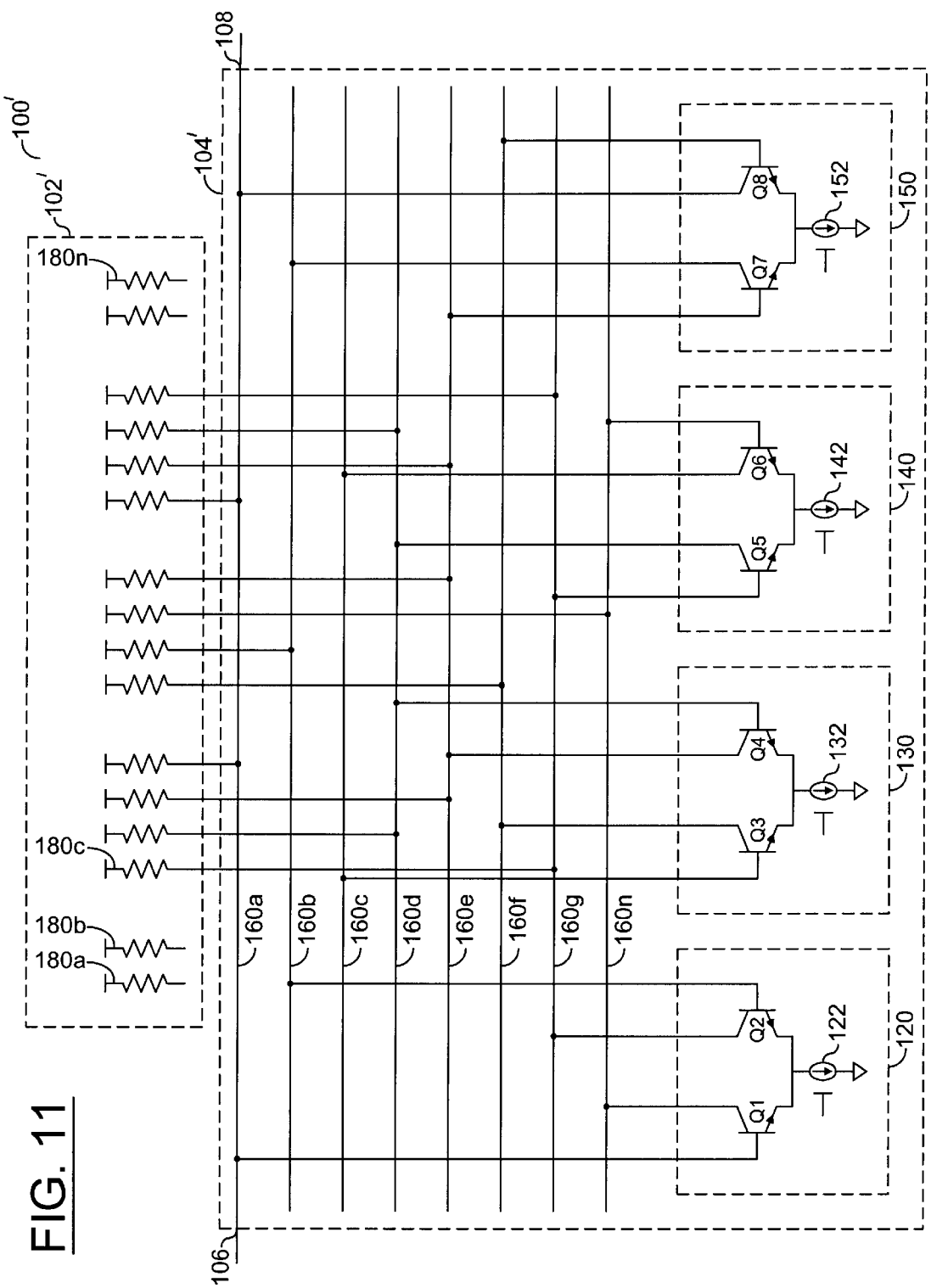
FIG. 11 is a detailed illustration of a preferred embodiment of the present invention.

FIG. 11 is a detailed drawing illustrating an embodiment of a multi-stage VCO circuit 100' comprising (i) a multi-stage clock circuit 104' and (ii) a load circuit 102'. The multi-stage clock circuit 104' generally comprises a stage 120, a stage 130, a stage 140, a stage 150, and a plurality of interconnect lines 160a–160n.

The stage 120 generally comprises a transistor Q1, a transistor Q2, and a constant current source 122. The transistors Q1, Q2 may be implemented, in one example, as one or more bipolar junction transistors. However, other types of transistors may be implemented accordingly to meet the design criteria of a particular implementation. The base of the transistor Q1 is generally connected to the interconnect line 160a. The collector of the transistor Q1 is generally connected to the interconnect line 160n. The emitter of the transistor Q1 is generally connected to the emitter of the transistor Q2 and an input of the constant current source 122. The base of the transistor Q2 is generally connected to the interconnect line 161. The collector of the transistor Q2 is generally connected to the interconnect line 166. An output of the constant current source 122 is generally connected to ground.

The stage 130, the stage 140 and the stage 150 have a similar configuration as the stage 120. The particular number of stages 120, 130, 140 and 150 may be adjusted accordingly to meet the design criteria of a particular implementation.

The load circuit 102' may be implemented, in one example, as a plurality of resistors 180a–180n each of a known value. The resistors 180a–180n may be configured as a resistor network. Other types of loads may be implemented accordingly to meet the design criteria of a particular implementation. The resistor 180c is generally connected between a supply voltage and the interconnect line 166. The input 106 may be connected, in one example, to the interconnect lines 160a–160n. The interconnect line 160 may be connected, in one example, to the output 108.

Figure 12:
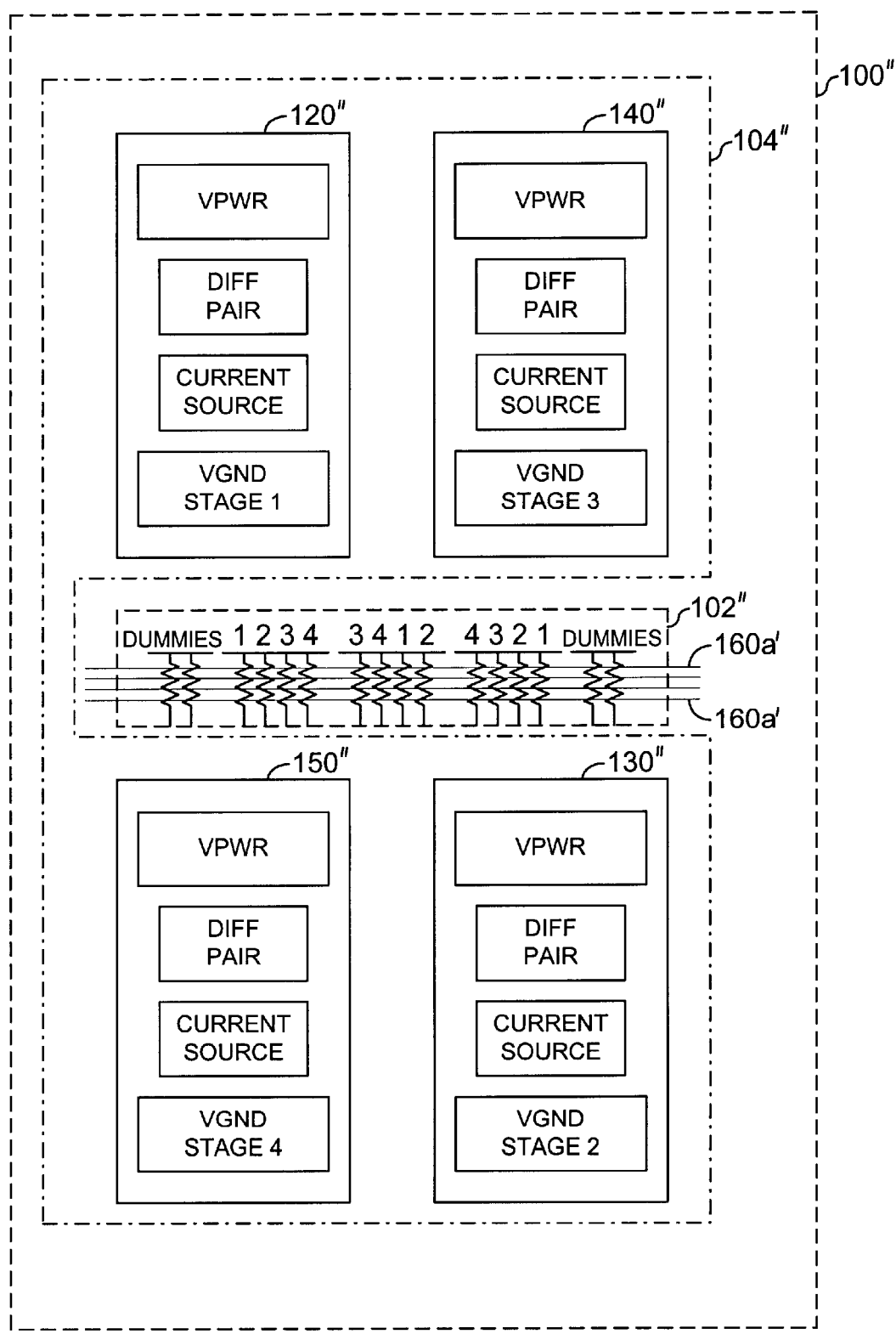
FIG. 12 is a diagram of an alternative embodiment of the present invention.

FIG. 12 is a diagram of a circuit 100" illustrating an alternative implementation of the present invention. The stages 120", 130", 140", 150" may be placed so that the interconnect lines 160a"–160n" and the load circuit 102" are located between the stages 120", 130", 140", 150".

The present invention may provide a multi-stage VCO apparatus 100 that may (i) be implemented as part of a PLL, (ii) be configured to generate a plurality of clock signals having precise phase relationships, (iii) have reduced load capacitance in each stage, (iv) have improved matching that eliminates non-linear factors, and (v) have a reduced effect of temperature variation across a chip.

The present invention may provide a method of precisely matching the stage delays in a ring VCO. The method of matching stage delays may comprise the steps of (i) removing critical matching elements from the stages, (ii) localizing the critical matching elements external to the stages, (iii) randomizing the critical matching elements, (iv) stretching the interconnect lines across all stages, (v) varying the placement of the interconnect lines to equalize the average layout gradient, (vi) varying the placement of stages to equalize the average layout gradient, and/or (vii) reducing the layout size of the stages.

The present invention may provide a large layout umbrella that could be applied to a large number of VCO designs where multi-phase or just stage matching is critical.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit comprising a plurality of stages, each stage configured to generate a clock signal in response to one or more control inputs, wherein said clock signal has a phase determined by one or more of a plurality of phase timing elements;
   a second circuit comprising said plurality of phase timing elements; and
   an interconnect matrix configured to couple said first circuit and said second circuit.

2. The apparatus according to claim 1, wherein said plurality of phase timing elements are localized to minimize process gradient.

3. The apparatus according to claim 1, wherein said plurality of phase timing elements are localized for gradient cancellation.

4. The apparatus according to claim 2, wherein said plurality of phase timing elements are disposed within said interconnect matrix.

5. The apparatus according to claim 2, wherein said plurality of phase timing elements are disposed beneath a power bus.

6. The apparatus according to claim 1, wherein said one or more phase timing elements connected to each stage are randomized.

7. The apparatus according to claim 1, wherein said one or more phase timing elements connected to each stage are gradient compensated.

8. The apparatus according to claim 1, wherein said plurality of phase timing elements comprise load elements.

9. The apparatus according to claim 1, wherein said plurality of phase timing elements comprise critical phase timing elements.

10. The apparatus according to claim 1, wherein each clock signal is generated in response to a different one of said plurality of phase timing elements.

11. The apparatus according to claim 1, wherein said plurality of clock signals comprises a multi-phase output clock signal.

12. The apparatus according to claim 1, wherein said apparatus comprises a voltage controlled oscillator.

13. The apparatus according to claim 12, wherein said voltage controlled oscillator is part of a phase-locked loop.

14. The apparatus according to claim 1, wherein said plurality of phase timing elements comprises one or more capacitors.

15. The apparatus according to claim 1, wherein said plurality of phase timing elements comprises one or more resistors.

16. The apparatus according to claim 1, wherein said plurality of phase timing elements comprise one or more resistors and one or more capacitors.

17. The apparatus according to claim 1 wherein:
   each of said plurality of stages comprises an inverting stage; and
   said second circuit comprises a resistor network connected between a supply voltage and said interconnect matrix.

18. The apparatus according to claim 17, wherein said inverting stages comprise a differential pair of transistors and a current source.

19. The apparatus according to claim 1, wherein said interconnect matrix comprises a plurality of interconnect lines disposed across all of said plurality of stages and configured to provide capacitance matching and equalize process gradient.

20. The apparatus according to claim 1, wherein said plurality of stages and said plurality of phase timing elements are connected to said interconnect matrix based on layout gradient.

* * * * *